United States Patent [19]
Sato et al.

[11] Patent Number: 4,677,474
[45] Date of Patent: Jun. 30, 1987

[54] WAFER PROBER

[75] Inventors: Mitsuya Sato; Bunei Hamasaki, both of Yokohama, Japan

[73] Assignee: Canon Kabushiki Kaisha, Tokyo, Japan

[21] Appl. No.: 749,505

[22] Filed: Jun. 27, 1985

[30] Foreign Application Priority Data

Jul. 2, 1984 [JP] Japan ................. 59-135086

[51] Int. Cl.$^4$ ............................................. H04N 7/18
[52] U.S. Cl. ................................ 358/101; 324/158 P
[58] Field of Search ................. 358/101, 93, 106, 107; 324/158 F, 158 P; 382/8

[56] References Cited

U.S. PATENT DOCUMENTS

| | | | |
|---|---|---|---|
| 3,899,634 | 8/1975 | Montone | 358/101 |
| 4,382,228 | 5/1983 | Evans | 324/158 P |
| 4,538,177 | 8/1985 | Morison | 358/101 |

*Primary Examiner*—Howard W. Britton
*Attorney, Agent, or Firm*—Fitzpatrick, Cella, Harper & Scinto

[57] ABSTRACT

A probing apparatus for use in examination of a chip formed on a wafer, in co-operation with a sheet-like member having probe needles to be contacted to the chip on the wafer, the probing apparatus being arranged so that the positions of the probe needles of the sheet-like member, when it is held by a holder of the probing apparatus, are detected automatically and, in accordance with the detected positions, the sheet-like member is displaced automatically so as to be aligned with the probing apparatus. According to another aspect of the invention, the position of the wafer when it is at a location under the probe needles is detected automatically and, in accordance with the detected position, the wafer is displaced so as to be aligned with the sheet-like member which has been aligned automatically with the probing apparatus. In one preferred form, a TV camera is provided at a position above the probing station, the TV camera being adapted to view the probe needles of the sheet-like member during positioning of it and to view the wafer when it is at a probing station, during positioning of the wafer.

12 Claims, 7 Drawing Figures

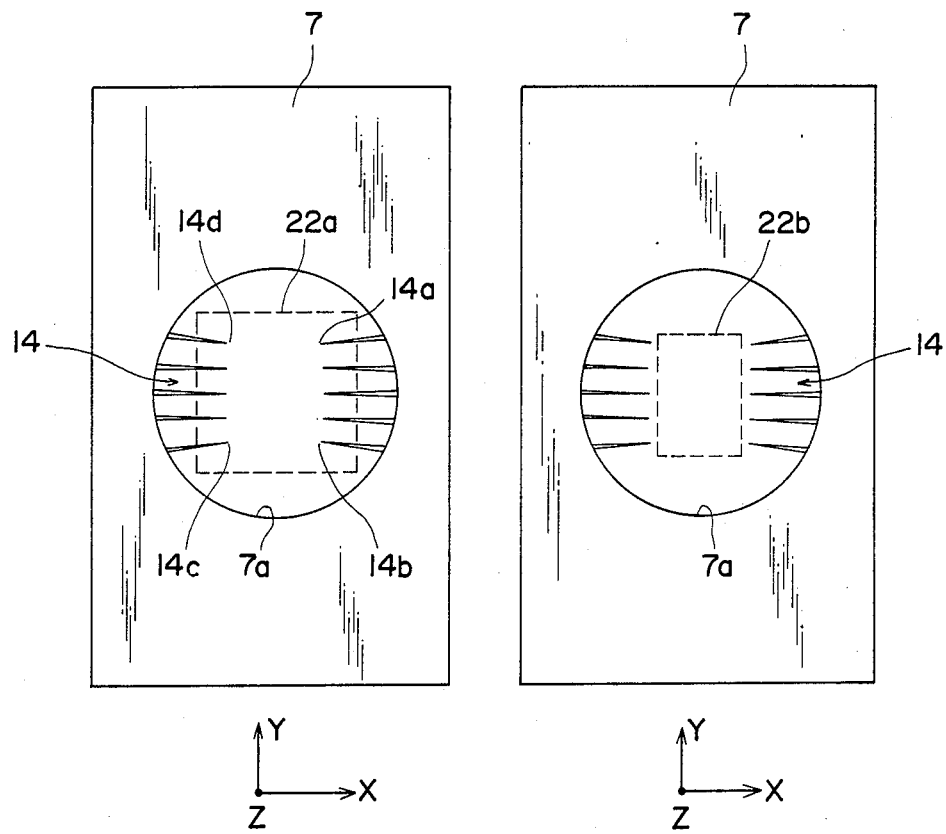

WAFER PROBER

BACKGROUND OF THE INVENTION

This invention relates to a probing apparatus and, more particularly, to a wafer prober for use in the examination of electrical characteristics of semiconductor devices formed on a wafer, during the manufacture of such semiconductor devices.

Usually in the field of manufacture of semiconductor devices such as integrated circuits (ICs), and during one of the final stages of the manufacture, the electrical characteristics of semiconductor devices, called IC chips, formed on a silicon wafer or the like are examined. Such examination is normally effected prior to cutting the wafer to divide the same into respective IC chips. For the sake of such examination, an integrated-circuit tester, called an IC tester, and a probing apparatus, called a wafer prober, are used. The examination itself of the electrical characteristics of each of the IC chips is carried out actually by the IC tester, and the wafer prober is used in order to establish an electrical connection between the IC tester and each of the IC chips on the wafer. An example of a known type wafer prober is shown in FIG. 7.

The water prober shown in FIG. 7 includes a sender carrier 1 which contains a plurality of wafers each having formed thereon a number of IC chips. For the examination, a first one of such wafers, to be tested, is fed to a wafer stage 3 of the probing apparatus. The wafer stage is movable in the directions of X, Y, Z and θ (as labelled in FIG. 7). On the other hand, a probe card 7 associated with the wafer 4 to be tested is introduced into the probing apparatus and then is held by a holder 11 for rotational displacement in an X-Y plane. Although not shown in this Figure, the probe card 7 has mounted thereon a plurality of probe needles with tips. The number of the probe needles and the positions of the needle tips correspond respectively to the number and the locations of bonding pads of each IC chip on the wafer. The bonding pad is the area defined on the IC chip to which a bonding wire is to be connected at a later stage during the manufacture of the semiconductor devices.

The probe card 7 and the wafer stage 3, carrying the wafer 4, are relatively displaced so that the tips of the probe needles are aligned with the bonding pads of one of the IC chips which is now going to be examined. Subsequently, the wafer stage is moved upwardly in the Z direction until the tips of the probe needles contact the bonding pads of the IC chip, respectively. By thus bringing the needle tips into contact with the bonding pads, the IC chip is electrically connected to an unshown IC tester so that the examination of the electrical characteristics of the IC chip is carried out.

Upon completion of the examination, the wafer stage 3 is moved downwardly in the Z direction and then is moved stepwisely in the X and/or Y direction relative to the probe card so that a second IC chip is examined in a similar manner. This is repeated until all the remaining IC chips are examined. If the examination results show that the IC chip is defective, an unshown inker is used to mark such IC chip. When the examination relative to all the IC chips on the wafer 4 is completed, the wafer 4 is unloaded from the wafer stage 3 and is fed into a receiving carrier 9.

Thereafter, a second wafer is introduced into the probing apparatus and similar examination operations are carried out relative to the second wafer.

If the examination is to be made relative to different IC chips having different patterns (and thus having different geometrical arrangements of bonding pads), separate probe cards having different arrangements of probe needles are interchangeably used.

In any event, in order that the probe needles of the probe card are brought into correct contact with the bonding pads of the IC chip, respectively, an accurate alignment must be achieved between the probe card and the wafer (i.e. between the tips of the probe needles and the bonding pads) after they are introduced into the probing apparatus.

The alignment operation in the known type probing apparatus will now be described. Usually, the alignment of the wafer is effected through two steps, prealignment (coarse alignment) and final alignment (fine alignment).

The wafer prealignment is a step for coarsely positioning the wafer relative to the probing apparatus or the probe card. In FIG. 7 example, the wafer prealignment is carried out at a prealignment station 2 by mechanical positioning. By the wafer prealignment, the wafer is coarsely positioned so that its orientation flat extends in a desired direction relative to the probing apparatus.

After the wafer prealignment, the final or fine alignment of the wafer relative to the probe card is effected. As for the first wafer 4, the same is moved manually so that a predetermined one of the IC chips on the first wafer 4 is located under the probe needles. Subsequently, while observing the tips of the probe needles and the bonding pads of the IC chip through a microscope (alignment scope) 10, the probe card 7 is manually displaced in the rotational direction to remove the positional deviation in the rotational direction between the probe card 7 and the wafer 4 (i.e. between the tips of the probe needles and the bonding pads of the IC chip). By this, the positioning of the probe card 7 is completed. Then, while continuing the naked-eye observation, the wafer stage 3 is manually displaced minutely in the X and Y directions to accurately align the bonding pads of the IC chip and the tips of the probe needles. When this is achieved, the alignment of the first wafer 4 is completed.

On the other hand, the fine alignment of a second wafer, a third wafer, etc. can be effected automatically. For this purpose, the wafer prober shown in FIG. 7 is provided with an automatic alignment sensor 5 which is adapted to detect accurately the position of the wafer held by the wafer stage 3, through image processing (pattern matching) with the use of a TV camera or through a laser beam scanning system.

If the fine alignment relative to the second wafer, the third wafer, etc. is to be made automatically through the image processing, the following operations are carried out just after the completion of the fine alignment of the first wafer 4. That is, the first wafer 4, as to which the fine alignment is finished, is moved so that a predetermined area on the first wafer 4 is located at a position under the TV camera 5 provided for the sake of the image processing. By doing so, the image of the pattern in the predetermined area on the wafer 4 is picked up and the pattern is displayed in a cathode ray tube connected to the TV camera 5. Subsequently, of the pattern displayed, a desired or predetermined portion is selected and registered as a template. This template is used as a reference for detecting the position of each of the second wafer, the third wafer, etc. during the automatic fine alignment of these wafers.

Similarly, in the case of the automatic alignment through the laser beam scanning system, the first wafer as to which fine alignment has been achieved is moved by the wafer stage 3 so that a predetermined area on the first wafer is located under the sensor 5. By scanning the predetermined area with the laser beam, a reference signal train is obtained.

In any case, the fine alignment of the second wafer, the third wafer, etc. is accomplished with the predetermined area of the wafer being moved to a position under the sensor 5.

Denoted by a numeral 6 in FIG. 7 is a height sensor which is adapted to detect the height of the wafer surface to thereby control the amount of upward displacement, in the Z direction, of the wafer stage 3 during the probing operation. The height sensor 6 is used also to detect the edge, the center, etc. of the wafer. Denoted by a numeral 8 is an operation panel with which the operator instructs various operations of the probing apparatus.

SUMMARY OF THE INVENTION

Usually, the IC chips on the wafer are arrayed in two orthogonal directions (X and Y directions). Therefore, in order to allow simplified and high-speed movement of the wafer within the probing apparatus, it is preferable to position the probe card, when it is introduced into the probing apparatus, in alignment with the X and Y axes (driving axes) of the wafer driving stage and also to position each of the wafers in alignment with the X and Y axes of the wafer stage. In the known type probing apparatus, as described above, the $\theta$-direction positioning of the probe card is accomplished by manually rotating the probe card in the $\theta$ direction while the operator observes the tips of the probe needles through the microscope (alignment scope 10 in FIG. 3). This is an extremely complicated and time-consuming operation. The positioning of the probe card is necessary each time the probe card is introduced or a probe card demounted for the purpose of cleaning or repair of its probe needles is remounted. Therefore, an extraordinarily prolonged time is required for the examination.

Further, in the known type probing apparatus, the registration of the template in relation to the first wafer and the automatic fine alignment of the second wafer, the third wafer, etc. are carried out at a position remote from the probing position under the probe needles. This is because the microscope 10 for the purpose of observation of the probe needles and the bonding pads is disposed at a position above the probing position so that no sensor such as the TV camera can be located above the probing station. Since the wafer alignment station is remote from the probing station, errors in the driving movement of the wafer stage for moving the wafer to the probing station from the alignment station significantly and adversely affects the alignment accuracy, so that it is difficult to maintain correct contact between the tips of the probe needles and the bonding pads of the IC chip. In addition, high accuracies are required for the driving movement of the wafer stage, which leads to increase in the manufacturing cost.

It is accordingly a primary object of the present invention to provide a probing apparatus by which the positioning of a probe card can be achieved automatically and with high accuracies.

It is another object of the present invention to provide a probing apparatus which assures improved accuracies for the alignment between a probe card and a wafer, i.e. the alignment of bonding pads of each IC chip with tips of probe needles.

Briefly, according to the present invention, there is provided a probing apparatus for use in examination of a chip formed on a wafer, in cooperation with a sheet-like member having probe needles to be contacted to the chip on the wafer, the probing apparatus being arranged so that the positions of the probe needles of the sheet-like member, when it is held by a holder of the probing apparatus, are detected automatically and, in accordance with the detected positions, the sheet-like member is displaced automatically so as to be aligned with the probing apparatus.

According to another aspect of the present invention, the position of the wafer when it is at a location under the probe needles is detected automatically and, in accordance with the detected position, the wafer is displaced so as to be aligned with the sheet-like member which has been aligned automatically with the probing apparatus. In one preferred form, a TV camera is provided at a position above the probing station, the TV camera being adapted to view the probe needles of the sheet-like member during positioning of it and to view the wafer when it is at a probing station, during positioning of the wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a plan view of the probe card when it is at a probing station, with a detection area for the automatic positioning of the probe card being shown by a broken-line block.

FIG. 3 is a view similar to FIG. 2, but the detection area is reduced for the purpose of automatic positioning of the wafer.

DESCRIPTION OF THE PREFERRED EMBODIMENTS

Figure 1:
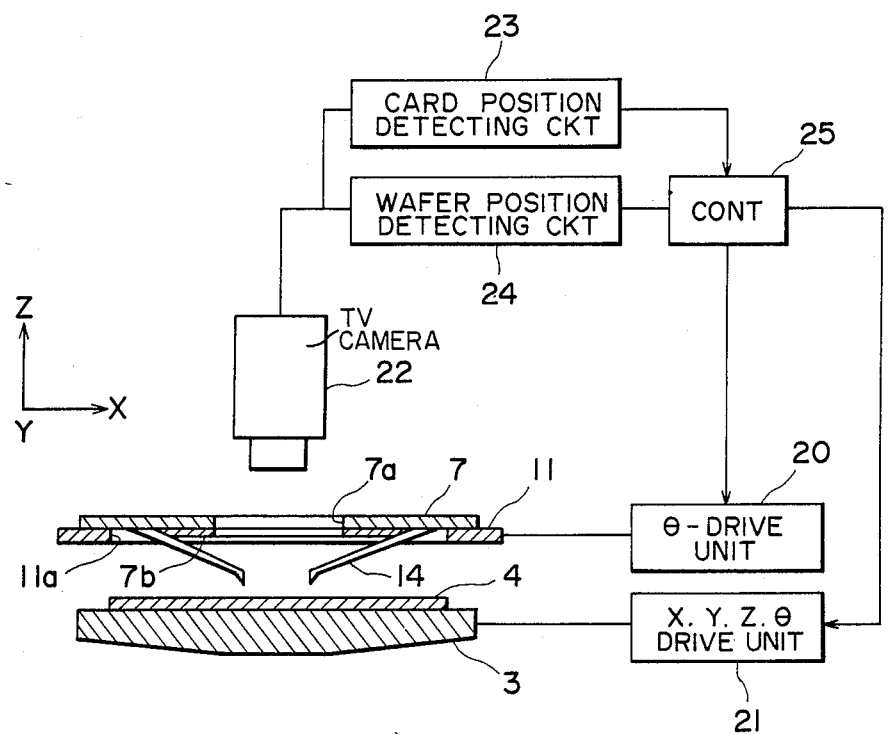
FIG. 1 is a sectional and diagrammatic view schematically showing a probing apparatus, according to an embodiment of the present invention, with a probe card and a wafer being at a probing station.
Figure 7:
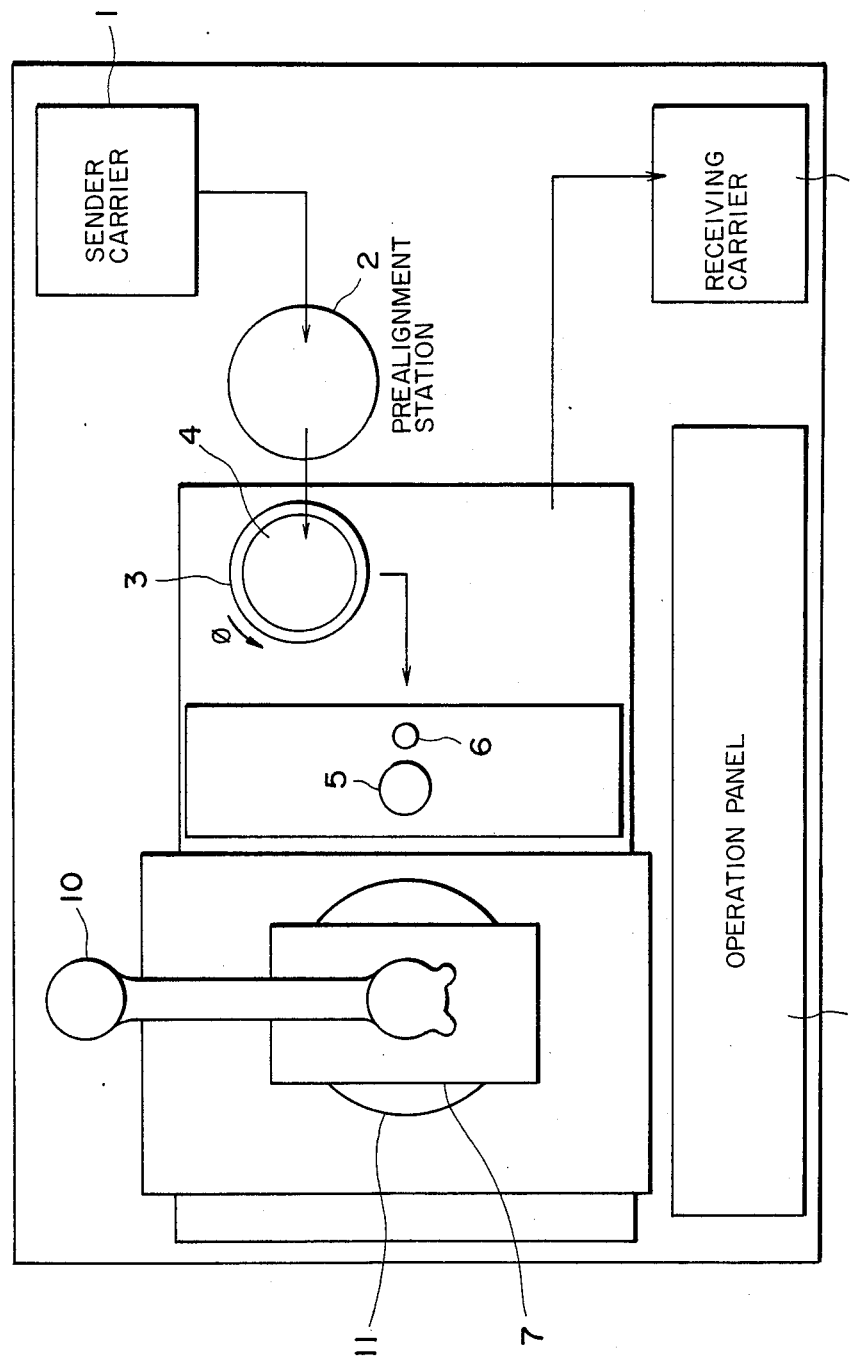
FIG. 7 is a plan view schematically showing a probing apparatus of known type.

Referring now to FIG. 1, there is shown a wafer prober according to an embodiment of the present invention, with the elements corresponding to those of the FIG. 7 example being denoted by the same reference numerals. In FIG. 1, there are also shown a wafer 4 and a probe card 7, both of which are of conventional type.

As shown in FIG. 1, the probe card 7 includes an electrically insulating flat sheet-like member having an aperture 7a of substantially circular shape formed at a position substantially the middle of the sheet-like member in its widthwise direction (X direction). The probe card 7 is provided with a plurality of electrically conductive fine probe needles 14 mounted on the peripheral portion of the sheet-like member around the aperture 7a. The probe needles 14 extend generally toward the central portion of the aperture 7a from the peripheral portion thereof and extend inclinedly downwardly in the direction Z so that their tips or free ends extend beyond the lower surface of the probe card 7. Fixedly secured by adhesion or the like to the lower surface of the probe card 7 is an annular support 7b for fixedly supporting the probe needles 14.

The probing apparatus includes a card holder 11 rotatably connected to an unshown housing of the probing apparatus. The card holder 11 is adapted to hold the probe card 7 when the latter is introduced into the probing apparatus. The card holder 11 has a window 11a which allows the tip portions of the probe needles 14 to extend downwardly beyond the card holder 11 when the probe card 7 is disposed on the card holder 11. When the probe card 7 is held by the probe card 11, one side edge of the probe card 7 is connected to an unshown card edge connector of the probing apparatus, whereby the probe needles 14 are electrically connected to an IC tester, not shown in the drawings. The card holder 11 is connected to a $\theta$-drive unit 20 which is adapted to rotate the card holder 11 in the $\theta$-direction for the purpose of X-Y alignment of the probe card 7 which will be described later.

The probing apparatus further includes a wafer stage 3 for holding the wafer 4 by vacuum suction or the like. The wafer stage 3 is disposed within the unshown prober housing and is movable in the directions of X, Y, Z and $\theta$ (rotational). The wafer stage 3 is connected to a driving unit 21 adapted to move the wafer stage 3 in the directions of X, Y, Z and $\theta$.

The probing apparatus further includes a TV camera 22 disposed at a position above the probing station, more specifically, at a location generally aligned with the center of the tips of the probe needles 14 when the probe card 7 is held by the card holder 11. As will be described later, the TV camera 22 is provided in order to detect automatically the position of the probe card 7, particularly the positions of the tips of the probe needles 14, during positioning of the probe card 7 and also to view and detect the position of the wafer, particularly the position of the IC chip, held at the probing station. The TV camera 22 is connected to a card position detecting circuit 23 for the sake of automatic alignment of the probe card 7, while it is connected also to a wafer position detecting circuit 24 for the sake of automatic alignment of the wafer 4. In addition, the TV camera 22 is connected to a cathode ray tube, although not shown in the drawings.

The card position detecting circuit 23 and the wafer position detecting circuit 24 are connected to a common controller 25 which is connected to each of the driving units 20 and 21. The controller 25 is adapted to control the rotational displacement of the probe card 7 in the 8 direction in accordance with the result of detection by the card position detecting circuit 23 and also is adapted to control the rotational movement and the X-Y movement of the wafer stage 3 in accordance with the result of detection by the wafer position detecting circuit 24.

Referring to FIGS. 2 and 4-6, the positioning of the probe card 7 will now be described.

Although not shown in the drawings, the wafer prober is provided with a central processing unit (CPU) for controlling the entire apparatus. First, an operator handles the probe card 7 to locate it on the card holder 11, without loading the wafer stage 3 with any wafer. When the operator commands the automatic alignment of the probe card 7 from a key board or a mode changing switch provided on an unshown operation panel, the central processing unit produces an instruction signal which is applied to the TV camera 22 so that it is focused on the tips of the probe needles 14 of the probe card 7 (see FIG. 1), whereby a video image of the probe needles 14, including their tip portions, is obtained (see FIG. 2). The TV camera 22 has a reference composed of X and Y axes which have been preparatively aligned with the X and Y axes of the wafer stage 3, e.g., by aligning the center of the view field of the TV camera with the center of the wafer stage or by viewing, through the TV camera, alignment marks formed on the wafer stage. Therefore, when the video image of the probe needles 14 is obtained from the TV camera 22, the positions of the tips of the probe needles 14 (i.e. the position of the probe card 7) with respect to the X and Y co-ordinates of the wafer stage 3 can be detected.

More specifically, the video signal produced by the TV camera 22 is supplied to the card position detecting circuit 23 (FIG. 1). In this card position detecting circuit 23, such an area as denoted by a broken line block 22a in FIG. 2, which area contains the tip portions of the probe needles 14 and occupies a relatively large portion of the view field of the TV camera 22, is defined as a detection area. Then, the video image within the detection area 22a is transformed into multicode signals to obtain video data. The thus obtained video data is stored into a frame memory of the card position detecting circuit 23 (Step 101 in FIG. 6). The detection area 22a may be of rectangular shape as shown in FIG. 2 or of circular shape.

Subsequently, on the frame memory, the stored video data is subjected to an edge-emphasizing operation (Step 102). By this, there are obtained within the frame memory a plurality of patterns corresponding to the outer configurations of the portions of the probe needles 14, including their tips. In other words, the peripheral shape of each of the probe needles 14 within the detection area 22a is detected.

At Step 103, the position of the tip of one of the probe needles 14 is detected. More specifically, one of the plural patterns corresponding to the configurations of the probe needles 14 is selected and, on the frame memory, the edge or outline is traced from a point, on the outline, located at the outermost position of the frame memory. Then, while continuing the tracing, a tangent with respect to each point on the outline is calculated. When such a point on the outline that has a tangent normal to the tangent of the tracing-starting point is detected, such point can be recognized as the tip of the probe needle, so the position of that point with respect to the X and Y co-ordinates of the TV camera 22 is stored into a memory.

The operation at the Step 103 is repeated relative to each of the remaining probe needles (Step 104), whereby the position of each of their tips is detected and stored into the memory.

Among the thus detected points corresponding to the needle tips, four tips each having a maximum value (positive or negative) with respect to the X direction or the Y direction in the X-Y co-ordinates of the TV camera 22 are selected (Step 105). Apparently, these four points correspond respectively to the positions of the tips 14a–14d of the four probe needles located at the outermost positions within the detection area 22a.

Figure 4:
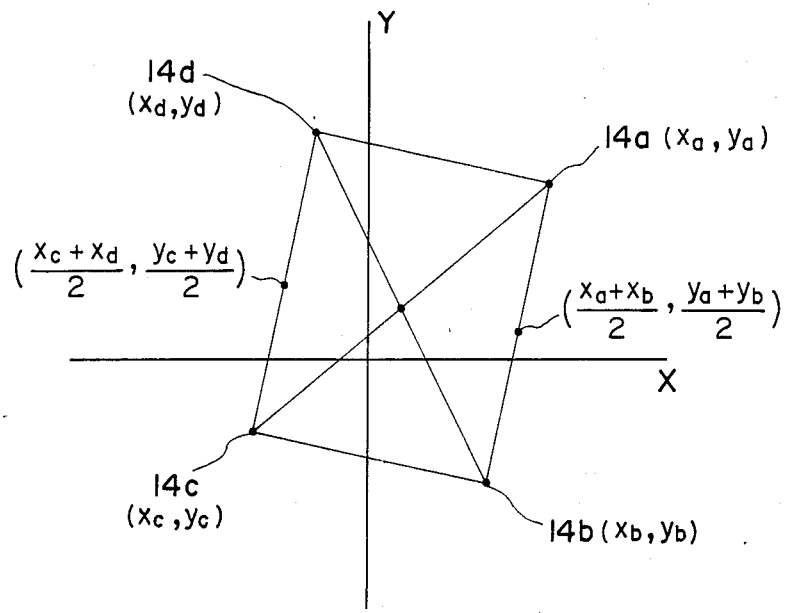
FIGS. 4 and 5 are explanatory illustrations for showing the manner of automatic alignment of the probe card of FIG. 2.

For illustration, the positions of the four points with respect to the X-Y co-ordinates of the TV camera 22, in a case where the probe card 7 held by the card holder 11 contains a positional deviation in the $\theta$ direction relative to the wafer stage 3, are shown in FIG. 4. In this Figure, the point 14a has a position which is the maximum in the positive X direction, the point 14b has a position which is the maximum in the negative Y direction, the point 14c has a position which is the maximum in the negative X direction, and the point 14d has a position which is the maximum in the positive Y direction. By calculating each of the distance between the point 14a and the point 14b, the distance between the point 14b and the point 14c, the distance between the point 14c and the point 14d and the distance between the point 14d and the point 14a, and by comparing the results of calculation with the preparatively and actually measured distances between the tips 14a–14d of the probe needles, respectively, whether or not the tips 14a–14b of the outermost four probe needles have been really detected can be discriminated (Step 105).

If the points 14a–14d are detected, the following calculations are carried out at Step 106 to detect the positional error of the probe card 7 in the $\theta$ direction, with respect to the X and Y co-ordinates of the wafer stage 3:

$$\theta 1 = \tan^{-1}[\{(ya+yb)/2 - (yc+yd)/2\}/\{(x-a+xb)/2 - (xc+xd)/2\}] \quad (1)$$

$$\theta = \theta 1 - \theta 2 \quad (2)$$

wherein $\theta 1$ is the amount of deviation calculated from the positions of the four points 14a–14d; $\theta 2$ is angular data which is peculiar to the probe card 7 in respect to the positional relation in the rotational direction between the probe card and the probe needles and which has been initially inputted to the memory of the card position detecting circuit 23; and $\theta$ is the actual rotational deviation of the probe card 7 and is an angle by which the probe card 7 is displaced rotationally in order to attain alignment with the wafer stage 3.

When the angle $\theta$ is detected from the equations (1) and (2), the card position detecting circuit 23 produces a signal which is applied to the controller 25. In response to the signal supplied from the card position detecting circuit 23, the controller 25 actuates the $\theta$-drive unit 20 to rotate the card holder 11 and therefore the probe card 7 by the angle $\theta$ (Step 107). By this, the positional error of the probe card 7 in the rotational direction, with respect to the X and Y co-ordinates of the wafer stage 3 is eliminated. In other words, the X and Y axes of the probe card 7 are aligned respectively with the X and Y axes of the wafer stage 3.

Figure 5:
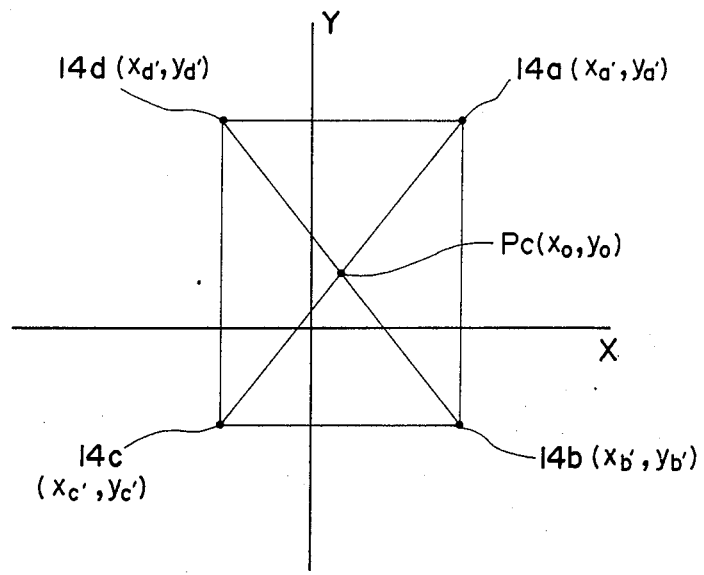
Figure 6:
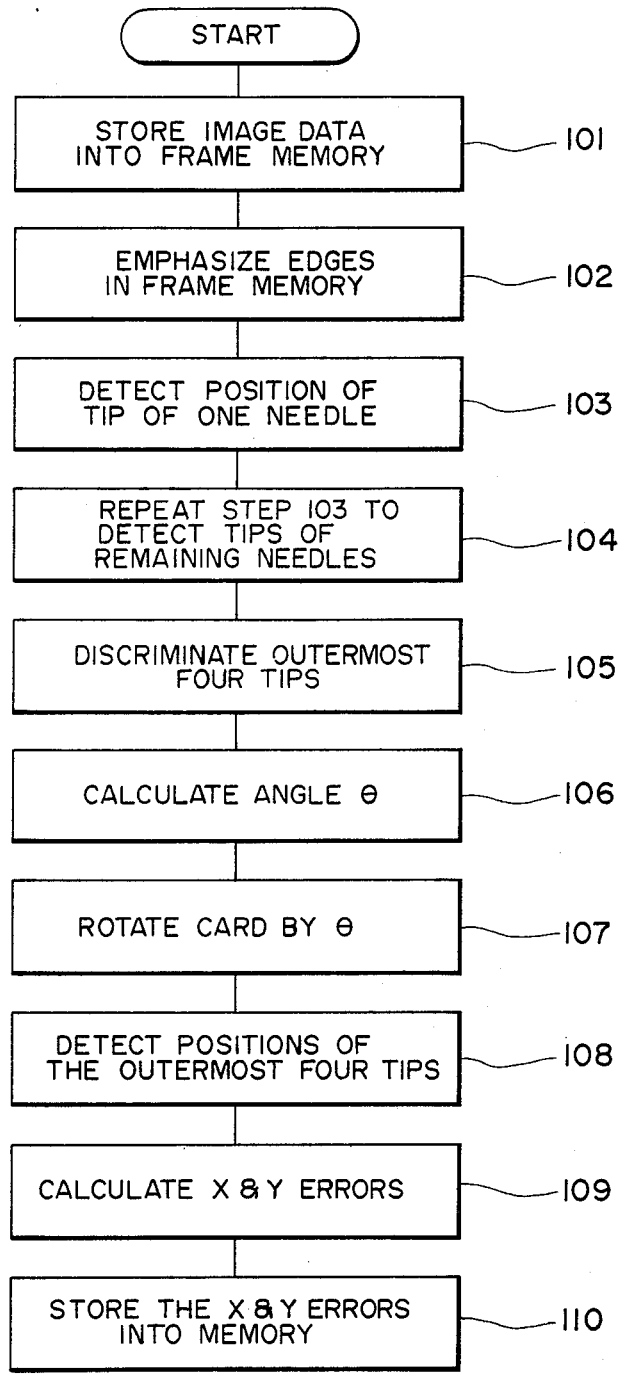
FIG. 6 is a flow chart showing the automatic alignment operation for the probe card of FIG. 2.

Subsequently, at Step 108, the operations described with reference to the Steps 101–105 are again carried out in the described sequence, so as to detect again the positions of the points 14a–14d. By doing so, the positions of the four points 14a–14d with respect to the X and Y co-ordinates are obtainable, such as shown in FIG. 5.

Subsequently, at Step 109, the following calculations are carried out to detect the X-Y position of the probe card 7 (or the X-Y position of the center Pc of the four needle tips 14a–14d) with respect to the X and Y co-ordinates of the wafer stage:

$$x_o = (xa' + xb' + xc' + xd')/4 \quad (3)$$

$$y_o = (ya' + yb' + yc' + yd')/4 \quad (4)$$

The values of $x_o$ and $y_o$ obtained from the equations (3) and (4) are the positional deviation, in the X and Y directions, of the probe card 7 relative to the wafer stage 3, and these values $x_o$ and $y_o$ are stored into the memory (Step 110). The thus detected X-Y error information will be used at a later stage as the displacement correcting data for the driving movement of the wafer stage 3.

Referring to FIGS. 1 and 3, the positioning of a first wafer will now be described.

After completion of the alignment of the probe card 7, the central processing unit produces an instruction signal for achieving prealignment of the first wafer such as 4 in FIG. 1 at an unshown prealignment station. The wafer prealignment is achieved by mechanical positioning or by detecting the peripheral shape of the wafer with the use of an unshown wafer edge sensor. By this wafer prealignment, the scribe lines between the IC chips are coarsely aligned, on the wafer stage 3, with the X and Y axes of the wafer stage. Thereafter, the wafer stage 3 is moved in the X and Y directions so that a predetermined IC chip on the wafer 4 held by the wafer stage 3 is moved to a position under the probe needles 14. At this poisition, the fine alignment of the wafer 4 is carried out in the following manner.

First, the wafer stage 3 is moved manually and minutely in the X or Y direction, while viewing the wafer 4 held on the wafer stage 3, through the display of the unshown cathode ray tube connected to the TV camera 22. If, within the display of the cathode ray tube, the scribe line displaces in the direction normal to the direction of elongation of it, the wafer stage 3 is rotated minutely in the $\theta$ direction until the scribe line becomes stationary, within the display of the cathode ray tube, with respect to the direction normal to the direction of elongation thereof irrespective of the X or Y movement of the wafer stage 3. When this is achieved, the positional error of the wafer 4 in the $\theta$ direction is eliminated. Subsequently, while monitoring through the display of the cathode ray tube, the wafer stage 3 is moved minutely in the X and/or Y direction until the bonding pads of the predetermined IC chip are accurately aligned with the tips of the probe needles 14, respectively. By this, the first wafer 4 is accurately aligned with the probe card 7.

Subsequently, while keeping the wafer 4 held at that position, a template is registered via the TV camera 22, for the sake of automatic fine alignment of the second wafer, the third wafer, etc. As for the template, a predetermined or desired portion of the pattern included in an area (such as a broken-line area 22b in FIG. 3) located within the view field of the TV camera 22 which area occupies a relatively small portion of the view field of the TV camera and excludes the probe needles 14, is selected and the corresponding video data is stored into the memory as the template.

After the template is registered, the wafer stage 3 is moved upwardly in the Z direction for the sake of examination of the predetermined IC chip. Upon completion of examination, the wafer stage 3 is moved downwardly in the Z direction and then is moved stepwise in the X and/or Y direction so that a second IC chip is positioned at the probing station. By repeating the wafer stage movement in the directions of X, Y and Z, all the chips on the first wafer 4 are examined.

The second wafer can be easily positioned in the following manner.

After the wafer prealignment, the wafer stage 3 is moved in the X and/or Y direction so that a predetermined one of the IC chips on the second wafer is moved to the probing station. By this, video information about the pattern of the predetermined IC chip is obtained through the TV camera 22. The video information is supplied to the wafer position detecting circuit 24 connected to the TV camera 22. In this wafer position detecting circuit 24, such an area of the view field of the TV camera 22 as denoted by the broken-line area 22b in FIG. 3, which area occupies a relatively small portion of the view field of the TV camera so that it does not include any probe needle 14, is defined as a detection area. Then, the pattern in the detection area 22b is compared with the template which has been registered in relation to the first wafer, whereby the position of the second wafer with respect to the X and Y co-ordinates of the wafer stage 3 is detected. Such pattern matching itself is known in the art. However, in this embodiment of the present invention, a relatively narrow area such as the detection area 22b, which does not include any probe needle 14, is selected for the sake of pattern matching. Since the probe needles are excluded from the detection area, any noise component which otherwise would be caused by the presence of the probe needles in the detection area is precluded and, therefore, higher reliabilities in the position detection by the pattern matching are assured.

On the basis of the thus detected positional information of the second wafer with respect to the X and Y co-ordinates of the wafer stage 3 and in accordance with the positional information on the probe card 7 with respect to the X and Y co-ordinate of the wafer stage 3 which has been detected during the positioning of the probe card 7, the displacement of the wafer stage 3 necessary for positioning the aforementioned predetermined IC chip of the second wafer in alignment with the tips of the probe needles 14 is calculated. Thereafter, in accordance with the results of calculation, the drive unit 21 is actuated by an instruction signal supplied thereto from the controller 25 to displace the second wafer. By this, the automatic fine alignment of the second wafer is accomplished. The subsequent operations are similar to those in relation to the first wafer. The positioning of the third wafer, a fourth wafer and so on is the same as that for the second wafer.

In accordance with the present invention, as has hitherto been described, the detection of the positions of the tips of the probe needles as well as the positioning of the probe card are achieved automatically with the use of a TV camera. This eliminates complicated manual operations which have conventionally been required for the alignment of the probe card and, therefore, assures reduction in the examination time. Additionally, according to the present invention, both the position detection for the probe card and the position detection for the wafer, i.e. both the position detection for the tips of the probe needles and the position detection for the IC chip on the wafer are effected at the same position or station, namely the probing station. This assures high-accuracy alignment between the probe needles and the bonding pads of the IC chip.

Since, in the known type probing apparatus as described hereinbefore, the wafer alignment station is far removed from the probing station, usually only a single wafer alignment operation has been carried out relative to each of the wafers. According to the present invention, on the other hand, the wafer alignment station is at the same position as the probing station. Therefore, the alignment operation (pattern matching operation) can be easily effected relative to each of desired ones of the IC chips on the same wafer, without adding unnecessary movement of the wafer stage 3. This prevents accumulation of errors in the wafer stage movement, even if the accuracies of the wafer stage movement are not extremely high. As the result, a correct contact is maintained stably between the tips of the probe needles and the bonding pads of each IC chip. Of course, the fine alignment operation may be effected relative to every one of the IC chips on the same wafer. Even in such case, any additional movement of the wafer stage is not at all required.

While the invention has been described with reference to the structures disclosed herein, it is not confined to the details set forth and this application is intended to cover such modifications or changes as may come within the purposes of the improvements or the scope of the following claims.

What is claimed is:

1. A probing apparatus for use in examination of a chip formed on a wafer, said apparatus being usable with a sheet-like member having probe needles to be contacted to the chip on the wafer, said apparatus comprising:
   means for holding the sheet-like member;
   means for driving said holding means to move the sheet-like member held by said holding means;
   means for detecting positions of the probe needles of the sheet-like member held by said holding means; and
   means for controlling movement of the sheet-like member by said driving means, in accordance with a result of detection of the positions of the probe needles.

2. An apparatus according to claim 1, wherein said detecting means includes a TV camera for viewing the probe needles of the sheet-like member held by said holding means.

3. A probing apparatus for use in examination of a chip formed on a wafer, said apparatus being usable with a sheet-like member having probe needles to be contacted to the chip on the wafer, said apparatus comprising:
   means for holding the sheet-like member;
   means for driving said holding means to move the sheet-like member held by said holding means;
   means for holding the wafer;
   means for driving said wafer holding means to move the wafer;
   means for detecting positions of the probe needles of the sheet-like member held by said holding means;
   means for controlling movement of the sheet-like member by said driving means, in accordance with a result of detection of the positions of the probe needles;
   means for detecting the position of the wafer held by said wafer holding means and at a station beneath the probe needles; and means for controlling movement of the wafer by the second-mentioned driving means, in accordance with a result of detection of the position of the wafer.

4. An apparatus according to claim 3, wherein a common TV camera is provided which camera is operable as one component of said needle position detecting means during the position detection for the sheet-like member to view the probe needles and also is operable as one component of said wafer position detecting means during the position detection for the wafer to view the wafer held at the station beneath the probe needles.

5. An apparatus according to claim 4, wherein the range of detection through said TV camera for the position detection with respect to the probe needles differs from that for the position detection with respect to the wafer.

6. An alignment method, comprising the steps of:
relatively positioning first and second objects so that the first object and a first region of the second object are brought into a predetermined positional relation with each other;
detecting and storing positional information related to a position of a second region of the second object, different from the first region, when the first region of the second object is in the predetermined positional relation with the first object;
relatively positioning a third object and the first object by use of the stored positional information related to the second region of the second object.

7. A method according to claim 6, wherein the method is applicable to alignment of a probe needle and chips on a semiconductor wafer and wherein the first object comprises the probe needle while the second and third objects comprise first and second chips on the wafer, respectively.

8. A method according to claim 7, wherein the first region of the second object comprises a region of a pad formed in association with the first chip of the wafer.

9. A method according to claim 8, wherein the second region of the second object comprises a region in which at least a portion of a pattern of the first chip of the wafer is formed.

10. A method according to claim 6, wherein the method is applicable to alignment of wafers having chips with respect to a probe needle and wherein the first object comprises the probe needle while the second and third objects comprise first and second wafers, respectively.

11. A method according to claim 10, wherein the first region of the second object comprises a region of a pad formed in association with a chip on the first wafer.

12. A method according to claim 11, wherein the second region of the second object comprise a region on the first wafer in which at least a portion of a pattern of the chip on the first wafer is formed.

* * * * *

UNITED STATES PATENT AND TRADEMARK OFFICE
CERTIFICATE OF CORRECTION

PATENT NO. : 4,677,474      Page 1 of 2

DATED : June 30, 1987

INVENTOR(S) : MITSUYA SATO, ET AL.

It is certified that error appears in the above-identified patent and that said Letters Patent is hereby corrected as shown below:

COLUMN 1

Line 27, "water" should read --wafer--.
    line 60, "stepwisely" should read --stepwise--.

COLUMN 3

Line 59, "affects" should read --affect--.

COLUMN 5

Line 20, "card 11," should read --card holder 11,--.
    Line 58, "8" should read --$\theta$--.

COLUMN 9

Line 41, "co-ordinate" should read --co-ordinates--.

UNITED STATES PATENT AND TRADEMARK OFFICE
CERTIFICATE OF CORRECTION

PATENT NO. : 4,677,474

DATED : June 30, 1987

INVENTOR(S) : MITSUYA SATO, ET AL.

It is certified that error appears in the above-identified patent and that said Letters Patent is hereby corrected as shown below:

COLUMN 12

Line 27, "comprise" should read --comprises--.

Signed and Sealed this

Seventeenth Day of November, 1987

Attest:

DONALD J. QUIGG

*Attesting Officer*  *Commissioner of Patents and Trademarks*